(12) United States Patent
Maeda et al.

(10) Patent No.: US 12,451,407 B2
(45) Date of Patent: Oct. 21, 2025

(54) COMPOSITE MATERIAL, SEMICONDUCTOR PACKAGE, AND METHOD OF MANUFACTURING COMPOSITE MATERIAL

(71) Applicants: SUMITOMO ELECTRIC INDUSTRIES, LTD., Osaka (JP); A.L.M.T. Corp., Tokyo (JP)

(72) Inventors: Toru Maeda, Osaka (JP); Miki Miyanaga, Osaka (JP); Daisuke Kondo, Osaka (JP); Kei Hirai, Osaka (JP); Masayuki Ito, Yamagata (JP); Shin-Ichi Yamagata, Yamagata (JP)

(73) Assignees: Sumitomo Electric Industries, Ltd., Osaka (JP); A.L.M.T. Corp., Tokyo (JP)

( * ) Notice: Subject to any disclaimer, the term of this patent is extended or adjusted under 35 U.S.C. 154(b) by 241 days.

(21) Appl. No.: 18/268,333

(22) PCT Filed: Dec. 22, 2021

(86) PCT No.: PCT/JP2021/047541
§ 371 (c)(1),
(2) Date: Jun. 20, 2023

(87) PCT Pub. No.: WO2022/138711
PCT Pub. Date: Jun. 30, 2022

(65) Prior Publication Data
US 2024/0304514 A1    Sep. 12, 2024

(30) Foreign Application Priority Data
Dec. 24, 2020   (JP) .................................. 2020-214612

(51) Int. Cl.
*F28F 7/00*       (2006.01)
*B22F 7/04*       (2006.01)
(Continued)

(52) U.S. Cl.
CPC ............ *H01L 23/3735* (2013.01); *B22F 7/04* (2013.01); *B32B 15/01* (2013.01); *H01L 21/4871* (2013.01)

(58) Field of Classification Search
CPC .... H01L 23/3735; H01L 21/4871; B22F 7/04; B32B 15/01
(Continued)

(56) References Cited

U.S. PATENT DOCUMENTS

| 2012/0234524 A1* | 9/2012 | Fan ........................ B32B 9/007 |
|---|---|---|
|  |  | 165/185 |
| 2017/0198991 A1 | 7/2017 | Oki et al. |

FOREIGN PATENT DOCUMENTS

| JP | 6-268117 A | 9/1994 |
|---|---|---|
| JP | 2005340560 A * | 12/2005 |

(Continued)

*Primary Examiner* — Davis D Hwu
(74) *Attorney, Agent, or Firm* — Renner, Otto, Boisselle & Sklar, LLP

(57) ABSTRACT

A composite material has a plate shape and has a first surface and a second surface. The second surface is opposite to the first surface. The composite material includes a plurality of first layers and at least one second layer. The first layers and the second layer are alternately layered along a thickness direction of the composite material such that the first layers are located at the first surface and the second surface. Each of the first layers is a layer including copper. The second layer is a layer of a molybdenum powder compact impregnated with copper. A compressive residual stress of 50 MPa or less acts on each of the first layer located at the first surface and the first layer located at the second surface.

18 Claims, 9 Drawing Sheets

(51) Int. Cl.
*B32B 15/01* (2006.01)
*H01L 21/48* (2006.01)
*H01L 23/373* (2006.01)

(58) Field of Classification Search
USPC ........................................................ 165/80.2
See application file for complete search history.

(56) References Cited

FOREIGN PATENT DOCUMENTS

| JP | 2006-60247 A | 3/2006 |
| JP | 2007-115731 A | 5/2007 |
| JP | 2007-142126 A | 6/2007 |
| JP | 2019-096654 A | 6/2019 |
| JP | 6732395 B1 | 7/2020 |
| WO | 2015/182385 A | 12/2015 |

\* cited by examiner ional Patent Application No.
COMPOSITE MATERIAL, SEMICONDUCTOR PACKAGE, AND METHOD OF MANUFACTURING COMPOSITE MATERIAL

TECHNICAL FIELD

The present disclosure relates to a composite material, a semiconductor package, and a method of manufacturing the composite material. The present application claims a priority based on Japanese Patent Application No. 2020-214612 filed on Dec. 24, 2020. The entire contents of the Japanese patent application are incorporated herein by reference.

BACKGROUND ART

PTL 1 (Japanese Patent Laying-Open No. 2019-96654) describes a heat radiation plate. The heat radiation plate described in PTL 1 has a first surface and a second surface. The second surface is opposite to the first surface. The heat radiation plate described in PTL 1 has a plurality of copper layers and a plurality of copper-molybdenum layers. The copper layers and the copper-molybdenum layers are alternately layered along a thickness direction of the heat radiation plate such that the copper layers are located at the first surface and the second surface of the heat radiation plate. The heat radiation plate described in PTL 1 is bonded to a package member by brazing.

CITATION LIST

Patent Literature

PTL 1: Japanese Patent Laying-Open No. 2019-96654

SUMMARY OF INVENTION

A composite material of the present disclosure has a plate shape and has a first surface and a second surface. The second surface is opposite to the first surface. The composite material includes: a plurality of first layers; and at least one second layer. The first layers and the second layer are alternately layered along a thickness direction of the composite material such that the first layers are located at the first surface and the second surface. Each of the first layers is a layer including copper. The second layer is a layer of a molybdenum powder compact impregnated with copper. A compressive residual stress of 50 MPa or less acts on each of the first layer located at the first surface and the first layer located at the second surface.

DETAILED DESCRIPTION

Figure 1:
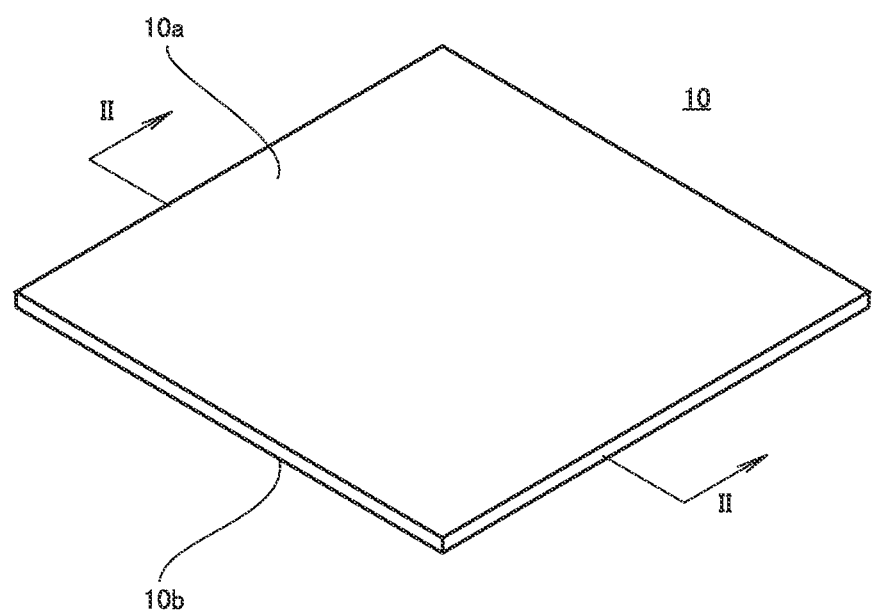
FIG. 1 is a perspective view of a composite material 10.

Problem to be Solved by the Present Disclosure

According to a finding by the present inventors, in the heat radiation plate described in PTL 1, a crack is generated between a copper layer and a copper-molybdenum layer due to heat when brazing is performed, thus resulting in an increased linear expansion coefficient.

The present disclosure provides: a composite material that can maintain a low linear expansion coefficient even after heat for brazing is applied; a semiconductor package using the composite material; and a method of manufacturing the composite material.

Advantageous Effect of the Present Disclosure

According to the composite material of the present disclosure, a low linear expansion coefficient and a high thermal conductivity can be maintained even after heat for brazing is applied.

DESCRIPTION OF EMBODIMENTS

First, embodiments of the present disclosure are listed and described.

(1) A composite material according to one embodiment of the present disclosure has a plate shape and has a first surface and a second surface. The second surface is opposite to the first surface. The composite material includes: a plurality of first layers; and at least one second layer. The first layers and the second layer are alternately layered along a thickness direction of the composite material such that the first layers are located at the first surface and the second surface. Each of the first layers is a layer including copper. The second layer is a layer of a molybdenum powder compact impregnated with copper. A compressive residual stress of 50 MPa or less acts on each of the first layer located at the first surface and the first layer located at the second surface.

In the composite material of (1), since the compressive residual stress acting on each of the first layer located at the first surface and the first layer located at the second surface is small, each of the first layers is not greatly deformed even when the compressive residual stress is released at the time of applying heat for brazing, with the result that a crack is less likely to be generated at an interface between the first layer and the second layer. Therefore, according to the composite material of (1), a low linear expansion coefficient can be maintained even after heat for brazing is applied.

(2) In the composite material of (1), a linear expansion coefficient of the composite material in a direction parallel to the first surface and the second surface when a temperature of the composite material is changed from a room temperature to 200° C. after holding at 800° C. for 15 minutes may be 6 ppm/K or more and 10 ppm/K or less. A thermal conductivity of the composite material in the thickness direction after holding at 800° C. for 15 minutes may be 230 W/m·K or more.

According to the composite material of (2), a low linear expansion coefficient and a high thermal conductivity can be maintained even after heat for brazing is applied.

(3) In the composite material of (1) or (2), a total number of the first layers and the second layer may be 5 or more. A thermal conductivity of the composite material in the thickness direction after holding at 800° C. for 15 minutes may be 261 W/m·K or more.

According to the composite material of (3), a higher thermal conductivity can be maintained after heat for brazing is applied.

(4) In the composite material of (1) to (3), a linear expansion coefficient of the composite material in a direction parallel to the first surface and the second surface when a temperature of the composite material is changed from a room temperature to 800° C. before holding at 800° C. for 15 minutes may be 7.5 ppm/K or more and 8.5 ppm/K or less.

According to the composite material of (4), when brazing a case member to the composite material, a crack can be suppressed from being generated in the brazing material due to a difference between the linear expansion coefficient of the composite material and the linear expansion coefficient of the case member.

(5) In the composite material of (1) to (4), each of thicknesses of the first layer located at the first surface and the first layer located at the second surface may be 25% or less of a thickness of the composite material. A thickness of the second layer may be more than 10% of the thickness of the composite material. A volume ratio of molybdenum in the second layer may be 55% or more. A volume ratio of molybdenum in the composite material may be more than 13% and less than 43%.

(6) In the composite material of (1) to (5), a volume ratio of the copper in each of the first layer located at the first surface and the first layer located at the second surface may be 90% or more. Each of thicknesses of the first layer located at the first surface and the first layer located at the second surface may be 15% or more of a thickness of the composite material.

In the composite material of (6), a temperature difference between a central portion of the first surface (second surface) and an end portion of the first surface (second surface) can be reduced.

(7) In the composite material of (1) to (6), a thickness of the second layer may be 18% or more of a thickness of the composite material. A change in a linear expansion coefficient of the composite material in a direction parallel to the first surface and the second surface when a temperature of the composite material is changed from a room temperature to 200° C. before and after holding at 800° C. for 15 minutes may be 0.3 ppm/K or less.

According to the composite material of (7), the linear expansion coefficient can be further suppressed from being deteriorated due to application of heat for brazing.

(8) A composite material according to another embodiment of the present disclosure has a plate shape and has a first surface and a second surface. The second surface is opposite to the first surface. The composite material includes a plurality of first layers and at least one second layer. The first layers and the second layer are alternately layered along a thickness direction of the composite material such that the first layers are located at the first surface and the second surface. Each of the first layers is a layer including copper. The second layer is a layer of a molybdenum powder compact impregnated with copper. In the composite material, a linear expansion coefficient of the composite material in a direction parallel to the first surface and the second surface when a temperature of the composite material is changed from a room temperature to 200° C. after holding at 800° C. for 15 minutes is 6 ppm/K or more and 10 ppm/K or less. A thermal conductivity of the composite material in the thickness direction after holding at 800° C. for 15 minutes is 230 W/m·K or more.

According to the composite material of (8), a low linear expansion coefficient and a high thermal conductivity can be maintained even after heat for brazing is applied.

(9) In the composite material of (8), the linear expansion coefficient of the composite material in the direction parallel to the first surface and the second surface when the temperature of the composite material is changed from the room temperature to 800° C. before holding at 800° C. for 15 minutes may be 7.5 ppm/K or more and 8.5 ppm/K or less.

According to the composite material of (9), when brazing a case member to the composite material, a crack can be suppressed from being generated in the brazing material due to a difference between the linear expansion coefficient of the composite material and the linear expansion coefficient of the case member.

(10) In the composite material of (8) or (9), a total number of the first layers and the second layer may be 5 or more. The thermal conductivity of the composite material in the thickness direction after holding at 800° C. for 15 minutes may be 261 W/m·K or more.

According to the composite material of (10), a higher thermal conductivity can be maintained after heat for brazing is applied.

(11) In the composite material of (8) to (10), each of thicknesses of the first layer located at the first surface and the first layer located at the second surface may be 25% or less of a thickness of the composite material. A thickness of the second layer may be more than 10% of the thickness of the composite material. A volume ratio of molybdenum in the second layer may be 55% or more. A volume ratio of molybdenum in the composite material may be more than 13% and less than 43%.

(12) In the composite material of (8) to (11), a volume ratio of the copper in each of the first layer located at the first surface and the first layer located at the second surface may be 90% or more. Each of thicknesses of the first layer located at the first surface and the first layer located at the second surface may be 15% or more of a thickness of the composite material.

In the composite material of (12), a temperature difference between a central portion of the first surface (second surface) and an end portion of the first surface (second surface) can be reduced.

(13) In the composite material of (8) to (12), a thickness of the second layer may be 18% or more of a thickness of the composite material. A change in the linear expansion coefficient of the composite material in the direction parallel to the first surface and the second surface when the temperature of the composite material is changed from the room temperature to 200° C. before and after holding at 800° C. for 15 minutes may be 0.3 ppm/K or less.

According to the composite material of (13), the linear expansion coefficient can be further suppressed from being deteriorated due to application of heat for brazing.

(14) A semiconductor package according to one embodiment of the present disclosure includes: a composite material having a plate shape, the composite material having a first surface and a second surface opposite to the first surface; and a case member brazed to one of the first surface and the second surface. The composite material has a plurality of first layers and at least one second layer. The first layers and the second layer are alternately layered along a thickness direction of the composite material such that the first layers are located at the first surface and the second surface. Each of the first layers is a layer including copper. The second layer is a layer of a molybdenum powder compact impregnated with copper. A linear expansion coefficient of the composite material in a direction parallel to the first surface and the second surface when a temperature of the composite material is changed from a room temperature to 200° C. is 6 ppm/K or more and 10 ppm/K or less. A thermal conductivity of the composite material in the thickness direction is 230 W/m·K or more.

According to the semiconductor package of (14), a low linear expansion coefficient and a high thermal conductivity of the composite material can be maintained even after heat is applied during brazing.

(15) In the semiconductor package of (14), a total number of the first layers and the second layer may be 5 or more. The thermal conductivity of the composite material in the thickness direction after holding at 800° C. for 15 minutes may be 261 W/m·K or more.

According to the semiconductor package of (15), a higher thermal conductivity of the composite material can be maintained after heat for brazing is applied.

(16) In the semiconductor package of (14) or (15), each of thicknesses of the first layer located at the first surface and the first layer located at the second surface may be 25% or less of a thickness of the composite material. A thickness of the second layer may be more than 10% of the thickness of the composite material. A volume ratio of molybdenum in the second layer may be 55% or more. A volume ratio of molybdenum in the composite material may be more than 13% and less than 43%.

(17) In the semiconductor package of (14) to (16), a volume ratio of the copper in each of the first layer located at the first surface and the first layer located at the second surface may be 90% or more. Each of thicknesses of the first layer located at the first surface and the first layer located at the second surface may be 15% or more of a thickness of the composite material.

According to the semiconductor package of (17), a temperature difference between a central portion of the first surface (second surface) and an end portion of the first surface (second surface) can be reduced.

(18) In the composite material of (14) to (17), a thickness of the second layer may be 18% or more of a thickness of the composite material. A change in the linear expansion coefficient of the composite material in the direction parallel to the first surface and the second surface when the temperature of the composite material is changed from the room temperature to 200° C. before and after holding at 800° C. for 15 minutes may be 0.3 ppm/K or less.

According to the semiconductor package of (18), the linear expansion coefficient of the composite material can be further suppressed from being deteriorated due to application of heat for brazing.

(19) A method of manufacturing a composite material according to one embodiment of the present disclosure includes: preparing a layered structure; heating the layered structure; and performing rolling onto the layered structure in a heated state. The layered structure has a first surface and a second surface opposite to the first surface. The layered structure has a plurality of first plates and at least one second plate. The first members and the second plate member are alternately arranged along a thickness direction of the layered structure such that the first plate members are located at the first surface and the second surface. Each of the first plate members includes copper. The second plate member is a molybdenum powder impregnated with copper.

According to the method of manufacturing the composite material in (19), there can be obtained a composite material that can maintain a low linear expansion coefficient even after heat for brazing is applied.

Details of Embodiments of the Present Disclosure

Details of embodiments of the present disclosure will be described with reference to figures. In the figures described below, the same or corresponding portions are denoted by the same reference characters and the same explanation will not be described repeatedly.

First Embodiment

A composite material (hereinafter referred to as "composite material 10") according to a first embodiment will be described.

<Configuration of Composite Material 10>

Figure 2:
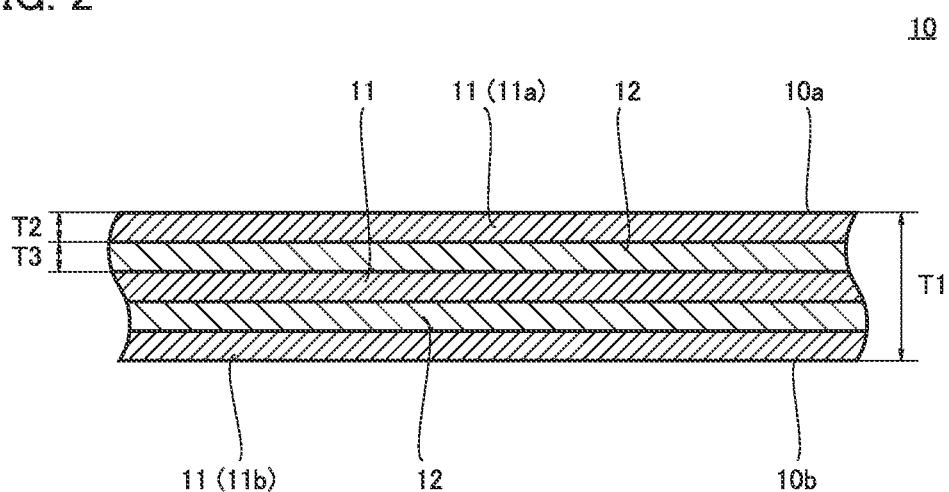
FIG. 2 is a cross sectional view at II-II of FIG. 1.

FIG. 1 is a perspective view of composite material 10. FIG. 2 is a cross sectional view at II-II of FIG. 1. As shown in FIGS. 1 and 2, composite material 10 has a plate shape. Composite material 10 has a first surface 10a and a second surface 10b. Second surface 10b is opposite to first surface 10a in the thickness direction of composite material 10.

The thickness of composite material 10 is defined as a thickness T1. Thickness T1 is a distance between first surface 10a and second surface 10b. Hereinafter, a direction orthogonal to the thickness direction of composite material 10 (direction parallel to first surface 10a and second surface 10b) may be referred to as an in-layer direction.

Composite material 10 has a plurality of first layers 11 and at least one second layer 12. The total number of first layers 11 and second layer 12 is 3 or more. First layers 11 and second layer 12 are alternately layered along the thickness direction of composite material 10. From another viewpoint, it can be said that second layer 12 is sandwiched between two first layers 11.

First layers 11 are located at first surface 10a and second surface 10b. First layer 11 located at first surface 10a may be referred to as a first layer 11a, and first layer 11 located at second surface 10b may be referred to as a first layer 11b.

The thickness of each of first layers 11 is defined as a thickness T2. Each of thickness T2 of first layer 11a and thickness T2 of first layer 11b is preferably 15% or more of thickness T1. Each of thickness T2 of first layer 11a and thickness T2 of first layer 11b is, for example, 25% or less of thickness T1.

Each of first layers 11 is a layer including copper. First layer 11 may include molybdenum in addition to the copper. A volume ratio of the copper in each of first layers 11 is, for example, 80% or more. The volume ratio of the copper in each of first layers 11 is preferably 90% or more. Each of first layers 11 may be pure copper (the volume ratio of the copper in each of first layers 11 may be 100%).

Each of a compressive residual stress acting on first layer 11*a* and a compressive residual stress acting on first layer 11*b* is 50 MPa or less. Each of the compressive residual stress acting on first layer 11*a* and the compressive residual stress acting on first layer 11*b* is preferably 40 MPa or less. Each of the compressive residual stress acting on first layer 11*a* and the compressive residual stress acting on first layer 11*b* is measured by an X-ray diffraction method (more specifically, a $\sin^2\varphi$ method).

In preparation of samples for measuring the compressive residual stress acting on first layer 11*a* (first layer 11*b*), first, measurement samples each having a width of 1 mm and a length of 5 mm are cut out from composite material 10. The width direction and the length direction of each of the measurement samples are orthogonal to the thickness direction of composite material 10.

Second, 20 measurement samples are arranged in contact with one another on a plane. On this occasion, each of the measurement samples is arranged such that its cross section parallel to the thickness direction of composite material 10 faces upward. Further, on this occasion, the measurement samples are arranged in two rows in the length direction of the measurement sample.

Third, the upper surfaces of the measurement samples arranged are polished. This polishing is performed to attain a level difference of 0.1 mm or less between the upper surfaces of the respective measurement samples. The residual stress is measured using the $\sin^2\varphi$ method by irradiating the upper surfaces of the measurement samples thus prepared with X rays (CuKα rays).

Second layer 12 is a layer of a copper-molybdenum infiltrant. The copper-molybdenum infiltrant is a material obtained by filling pores of a molybdenum powder compact (obtained by compressing and molding a molybdenum powder) with copper and performing rolling thereonto. Preferably, the volume ratio of the molybdenum in second layer 12 is 55% or more. The volume ratio of the molybdenum in second layer 12 is, for example, 85% or less.

The thickness of second layer 12 is defined as a thickness T3. Thickness T3 is preferably more than 10% of thickness T1. Thickness T3 is, for example, 35% or less of thickness T1. Thickness T3 and the volume ratio of the molybdenum in second layer 12 are preferably set such that the volume ratio of the molybdenum in composite material 10 becomes more than 13% and less than 43%. Thickness T3 is preferably 18% or more and 35% or less of thickness T1.

A linear expansion coefficient of composite material 10 in the in-layer direction when the temperature of composite material 10 is changed from 27° C. (hereinafter referred to as "room temperature") to 200° C. after holding at 800° C. for 15 minutes is preferably 6 ppm/K or more and 10 ppm/K or less.

The linear expansion coefficient of composite material 10 in the in-layer direction is measured based on an expansion displacement of composite material 10 in the in-layer direction when the temperature is changed from the room temperature to 200° C., because an operating temperature of a semiconductor package in which composite material 10 is to be used is taken into consideration. Further, the linear expansion coefficient of composite material 10 in the in-layer direction is measured after holding at 800° C. for 15 minutes, because application of heat at the time of brazing onto composite material 10 is taken into consideration.

The linear expansion coefficient of composite material 10 in the in-layer direction when the temperature of composite material 10 is changed from the room temperature to 800° C. before holding at 800° C. for 15 minutes is preferably 7.5 ppm/K or more and 8.5 ppm/K or less. This is because the following matter is taken into consideration: a case member to be brazed to composite material 10 is often composed of alumina and the linear expansion coefficient of alumina when the temperature is changed from the room temperature to 800° C. is about 8 ppm/K.

An amount of change (amount of increase) of the linear expansion coefficient of composite material 10 in the in-layer direction when the temperature of composite material 10 is changed from the room temperature to 200° C. before and after holding at 800° C. for 15 minutes is preferably 0.3 ppm/K or less.

The linear expansion coefficient of composite material 10 in the in-layer direction when the temperature is changed from the room temperature to 200° C. (800° C.) is calculated by measuring, using TD5000SA (manufactured by Bruker AXS), the expansion displacement of composite material 10 in the in-layer direction when the temperature is changed from the room temperature to 200° C. (800° C.). When calculating the linear expansion coefficient of composite material 10 in the in-layer direction when the temperature is changed from the room temperature to 200° C., the planar shape of composite material 10 is a quadrangular shape of 3 mm×15 mm. The measured value is an average value of three samples.

When the size of composite material 10 to be evaluated is smaller than 3 mm×15 mm, the linear expansion coefficient may be calculated using an X-ray diffraction method. By gathering a plurality of composite materials 10 in the form of small pieces to arrange the heat radiation surfaces thereof on the same plane, the area of the heat radiation surfaces becomes 100 mm² or more. The heat radiation surfaces of composite materials 10 gathered should form a quadrangular shape with each side of about 10 mm or more. A diffraction angle (2θ) is found from a diffraction peak corresponding to Cu(331) by irradiating the heat radiation surfaces with X rays at each of the room temperature and 800° C. By using the following formula in accordance with the diffraction angle, a ratio of change of lattice spacing can be used as the linear expansion coefficient. When there is anisotropy in the plane of the material, the samples are arranged such that the direction for measurement of the linear expansion coefficient is parallel to the incident plane of the X rays. The calculation formula for the linear expansion coefficient when the room temperature is set to 25° C. is shown as follows:

(Linear expansion coefficient) =

$(1/\sin(\theta \text{ at } 800° \text{ C.}) - 1/\sin(\theta \text{ at } 25° \text{ C.})) \times \sin(\theta \text{ at } 25° \text{ C.})/(800-25).$ Here, θ at 25° C. is ½ of diffraction angle 2θ when the measurement is performed at 25° C., and θ at 800° C. is ½ of diffraction angle 2θ when the measurement is performed at 800° C.

A thermal conductivity of composite material 10 in the thickness direction after holding at 800° C. for 15 minutes is preferably 230 W/m·K or more. The thermal conductivity of composite material 10 in the thickness direction after holding at 800° C. for 15 minutes is more preferably 261 W/m·K or more. The thermal conductivity is measured at the room temperature. It should be noted that the thermal conductivity of composite material 10 in the thickness direction after holding at 800° C. for 15 minutes is measured because application of heat at the time of brazing onto composite material is taken into consideration.

The thermal conductivity of composite material 10 in the thickness direction is measured by a laser flash method. More specifically, the thermal diffusion coefficient of composite material 10 is measured using LFA457 MicroFlash (manufactured by NETZSCH), and the thermal conductivity of composite material 10 in the thickness direction is calculated based on the thermal diffusion coefficient as well as the volume ratio and specific heat of each constituent material of composite material 10.

When calculating the thermal conductivity of composite material 10 in the thickness direction, composite material 10 is cut to have a circular planar shape with a diameter of 10 mm. When calculating the thermal conductivity, the specific heat of each constituent material is determined based on "Metal Databook, 4th edition" (2004 Maruzen Publishing) edited by the Japan Institute of Metals and Materials. Further, before measuring the thermal conductivity of composite material 10, the thermal conductivity of a pure copper sample having the same shape is measured under the same condition, and a result thereof is used as a reference to correct a measurement result of the thermal conductivity of composite material 10.

Figure 3A:
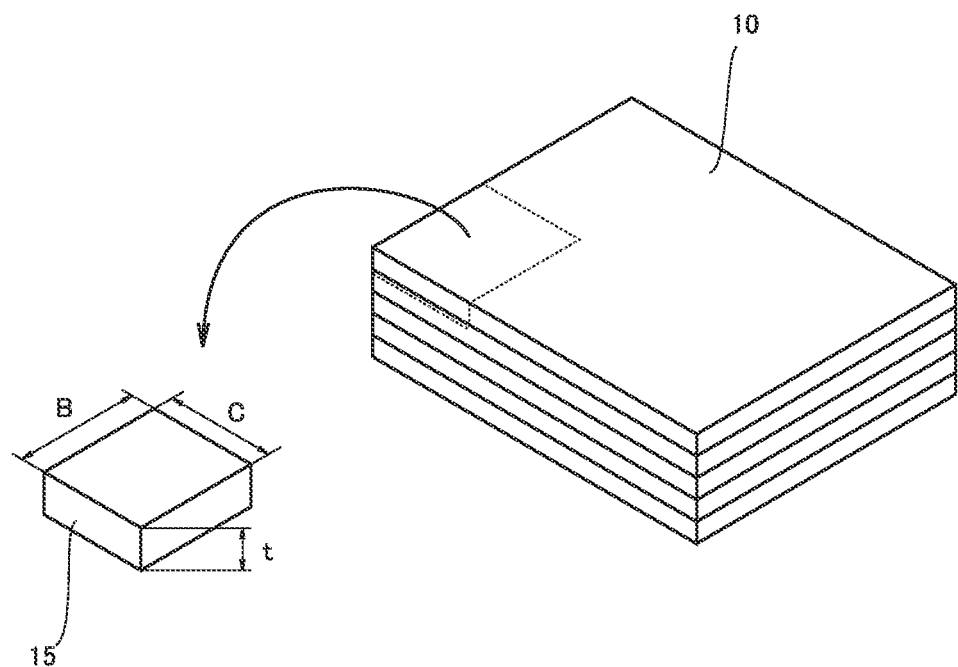
FIG. 3A is a first explanatory diagram of a procedure for preparing a sample for measuring a thermal conductivity of composite material 10 in a thickness direction of composite material 10.

FIG. 3A is a first explanatory diagram of a procedure for preparing a sample for measuring the thermal conductivity of composite material 10 in the thickness direction. As shown in FIG. 3A, a thin piece 15 is cut out from composite material 10 serving as a measurement target. The thickness, length, and width of thin piece 15 are t (mm), B (mm), and C (mm), respectively.

A number obtained by rounding up the digit(s) after the decimal point of a value obtained by dividing 2 by t is defined as X. A number obtained by rounding up the digit(s) after the decimal point of a value obtained by dividing 10 by B is defined as Y1. A number obtained by rounding up the digit(s) after the decimal point of a value obtained by dividing 10 by C is defined as Y2. The number of thin pieces 15 equal to the product of X, Y1 and Y2 are cut out from composite material 10 serving as the measurement target.

Figure 3B:
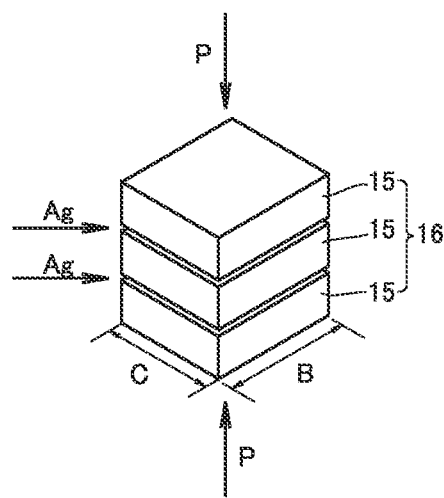
FIG. 3B is a second explanatory diagram of the procedure for preparing the sample for measuring the thermal conductivity of composite material 10 in the thickness direction of composite material 10.

FIG. 3B is a second explanatory diagram of the procedure for preparing the sample for measuring the thermal conductivity of composite material 10 in the thickness direction. As shown in FIG. 3B, a block 16 is produced from X thin pieces 15. The thickness, length and width of block 16 are about 2 (mm), B (mm) and C (mm), respectively. In the production of block 16, first, X thin pieces 15 are stacked. On this occasion, an amorphous powder composed of pure silver and having an average particle size of 4 μm is placed between adjacent thin pieces 15. An amount of the amorphous powder between adjacent thin pieces 15 is 0.2 g±30% per 100 mm².

In the production of block 16, second, a mold (not shown) having a quadrangular shape and provided with an opening having an inner size of B (mm)×C (mm) is prepared, and thin pieces 15 stacked are placed in the opening. The mold is composed of graphite. In the production of block 16, third, thin pieces 15 stacked are subjected to heat treatment under application of a load P. Load P is 4.9 N or more and 9.8 N or less. The heat treatment is performed in an inert gas atmosphere. The heat treatment is performed at a holding temperature of 900° C. for a holding time of 10 minutes. By the heat treatment, the amorphous powder is softened and deformed to adhere adjacent thin pieces 15 to each other, thereby producing block 16.

Figure 3C:
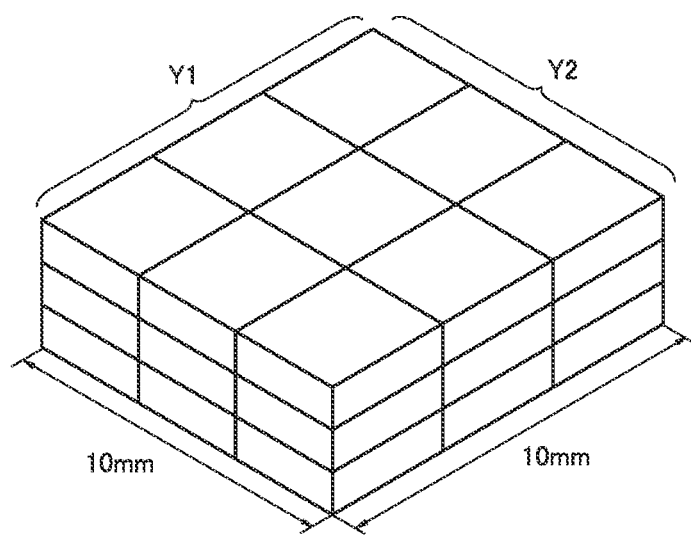
FIG. 3C is a third explanatory diagram of the procedure for preparing the sample for measuring the thermal conductivity of composite material 10 in the thickness direction of composite material 10.

FIG. 3C is a third explanatory diagram of the procedure for preparing the sample for measuring the thermal conductivity of composite material 10 in the thickness direction. As shown in FIG. 3C, a measurement sample 17 having a height of about 10 mm, a width of about 10 mm, and a thickness of about 2 mm is produced by arranging Y1 blocks 16 in rows and Y2 blocks 16 in columns. When arranging Y1 blocks 16 in rows and Y2 blocks 16 in columns, adjacent blocks 16 are adhered to each other by an adhesive member. As the adhesive member, a member that can withstand a temperature up to about 800° C. is used, such as a silver brazing foil or a ceramic adhesive agent. Y1 blocks 16 arranged in rows and Y2 blocks 16 arranged in columns may be fixed by winding a stainless steel wire or the like around the outer peripheries thereof.

Figure 4:
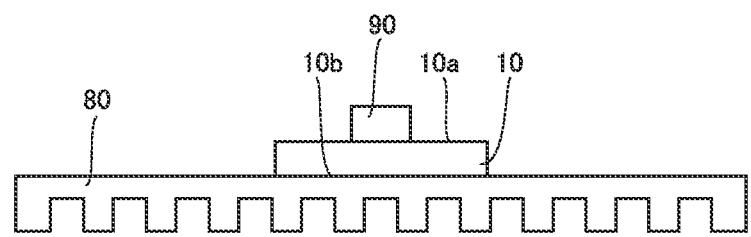
FIG. 4 is an explanatory diagram of a method of evaluating a heat radiation performance of composite material 10.

An end-portion temperature difference of composite material 10 is preferably 50° C. or less. FIG. 4 is an explanatory diagram of a method of evaluating a heat radiation performance of composite material 10. FIG. 4 schematically shows a state when viewed from one side surface of composite material 10. Composite material 10 is cut into a quadrangular shape having a length of 10 mm and a width of 10 mm when viewed in a direction perpendicular to first surface 10a. A heating element 90 is brought into contact with the center of first surface 10a of composite material 10 having been cut. Heating element 90 has a quadrangular shape having a length of 10 mm and a width of 10 mm when viewed in the direction perpendicular to first surface 10a. An amount of heat generated by heating element 90 is 50 W.

An aluminum fin 80 is adhered to second surface 10b of cut composite material using silicone oil (G-751 manufactured by Shin-Etsu Chemical). This adhering is performed by applying a load of 9.8 N with the silicone oil being placed between second surface 10b of cut composite material 10 and aluminum fin 80.

A temperature at an interface between first surface 10a of cut composite material 10 and heating element 90 is defined as a first temperature. A temperature at an end portion (corner portion) of first surface 10a of cut composite material 10 is defined as a second temperature. A temperature at an interface between second surface 10b of cut composite material 10 and aluminum fin 80 is defined as a third temperature. The first temperature, the second temperature, and the third temperature are measured by a thermocouple (not shown). Air cooling of aluminum fin 80 is controlled such that the third temperature becomes 25° C.±3° C. An ambient temperature as a measurement environment is set to 25° C.±5° C.

A difference (first temperature-second temperature) between the first temperature and the second temperature when 30 seconds or more elapses after heating element 90 is brought into contact with first surface 10a of cut composite material 10 and the temperature becomes a steady state is the end-portion temperature difference of composite material 10. For the end-portion temperature difference, measurement is performed ten times and an average value thereof is employed. That is, the end-portion temperature difference of composite material 10 is a difference between the temperature at the end portion (corner portion) of first surface 10a and the temperature at the portion of first surface 10a at which heating element 90 is in contact with first surface 10a with aluminum fin 80 being adhered to second surface 10b. As the end-portion temperature difference is smaller, thermal conduction of composite material 10 in the in-layer direction is more excellent.

<Method of Manufacturing Composite Material 10>

Figure 5:
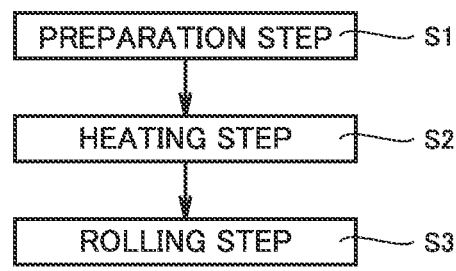
FIG. 5 is a diagram of a process of manufacturing composite material 10.

FIG. 5 is a diagram of a process of manufacturing composite material 10. As shown in FIG. 5, a method of manufacturing composite material 10 has a preparation step S1, a heating step S2, and a rolling step S3.

Figure 6:
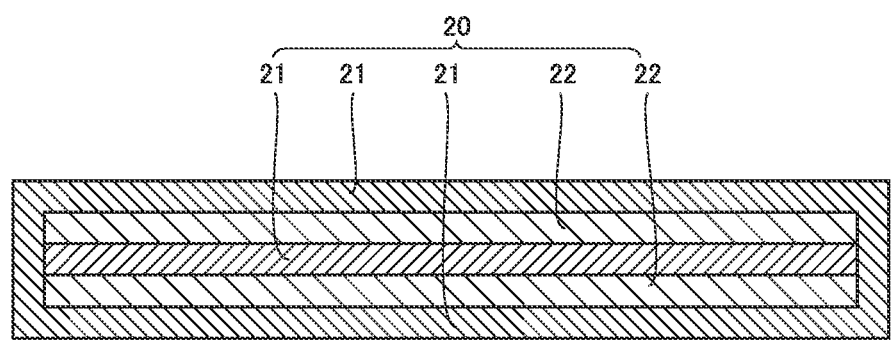
FIG. 6 is a cross sectional view of an exemplary layered structure 20.

In preparation step S1, a layered structure 20 is prepared. FIG. 6 is a cross sectional view of an exemplary layered structure 20. As shown in FIG. 6, layered structure 20 has a plurality of first plate members 21 and at least one second plate member 22. Each of first plate members 21 is composed of the same material as that of first layer 11, and second plate member 22 is composed of the same material as that of second layer 12. First plate members 21 and second plate member 22 are alternately arranged along the thickness direction of layered structure 20.

The side surfaces of layered structure 20 are covered with the same material as that of first plate member 21, thereby fixing layered structure 20 to avoid each layer from being moved in a direction of a plane perpendicular to the thickness direction. The method of fixing is not limited to this method, and the fixing may be performed by a method such as a method of providing a through hole and fixing with a rivet. Further, the layers may be fixed on another plate member so as to avoid the layers from being moved relative to each other.

In heating step S2, heating is performed onto layered structure 20 in which the layers are fixed. In this heat treatment, layered structure 20 is heated to a predetermined temperature in a hydrogen atmosphere. This predetermined temperature is a temperature of less than the melting point of copper. This predetermined temperature is, for example, 900° C.

Rolling step S3 is performed after heating step S2. In rolling step S3, layered structure 20 is caused to pass through a roller. Thus, first plate members 21 and second plate member 22 are bonded together while performing rolling onto first plate members 21 and second plate member 22, thereby manufacturing composite material having the structure shown in FIGS. 1 and 2. That is, in composite material 10, first layers 11 and second layer 12 are bonded together by a hot roll bonding method.

<Effects of Composite Material 10>

When a composite material having a plate shape with layers including copper (hereinafter referred to as "copper layers") and a layer including molybdenum and copper (hereinafter referred to as "copper-molybdenum layer") being alternately layered is used as a heat spreader of a semiconductor package, a case member is attached to a surface of the composite material by brazing. During the brazing, heat is normally applied at about 800° C. for about 15 minutes.

In the above-described composite material, the copper layers and the copper-molybdenum layer are normally bonded together using a diffusion bonding method. As a result, a large compressive residual stress acts on each of the copper layers. The copper layer is softened by the application of heat at the time of brazing. The compressive residual stress acting on the copper layer is released due to the softening of the copper layer, with the result that the copper layer is greatly deformed to generate a crack in a bonding interface between the copper layer and the copper-molybdenum layer. This crack leads to an increased linear expansion coefficient of the composite material in the in-layer direction.

In composite material 10, first layer 11 and second layer 12 are bonded together using the hot roll bonding method. When bonding using the hot roll bonding method, the cooling is performed while maintaining a state in which the temperature of first layer 11 is higher than the temperature of second layer 12 because the thermal conductivity of copper is larger than the thermal conductivity of molybdenum, with the result that a strain is less likely to remain in the vicinity of the interface between first layer 11 and second layer 12.

Therefore, in composite material 10, a crack is suppressed from being generated at the bonding interface between first layer 11 and second layer 12 after brazing the case member. That is, according to composite material 10, the linear expansion coefficient in the in-layer direction is maintained to be low even after brazing the case member.

In the case where the linear expansion coefficient of composite material 10 in the in-layer direction when the temperature of composite material 10 is changed from the room temperature to 200° C. after holding at 800° C. for 15 minutes is 6 ppm/K or more and 10 ppm/K or less and where the thermal conductivity of composite material in the thickness direction is 230 W/m·K or more (preferably 261 W/m·K or more), the linear expansion coefficient of composite material 10 in the in-layer direction can be reduced while maintaining the thermal conductivity of composite material 10 in the thickness direction, even after brazing the case member.

When each of thickness T2 of first layer 11a and thickness T2 of first layer 11b is 15% or more of thickness T1 and the volume ratio of the copper in each of first layer 11a and first layer 11b is 90% or more, heat is likely to be spread along the in-layer direction on each of the first surface 10a side and the second surface 10b side. Therefore, in this case, the end-portion temperature difference can be reduced.

Molybdenum has a linear expansion coefficient smaller than that of copper and has a thermal conductivity smaller than that of copper. Therefore, as the volume ratio of molybdenum in composite material 10 is larger, the linear expansion coefficient of composite material 10 in the in-layer direction is smaller and the thermal conductivity of composite material 10 in the thickness direction is smaller. As thickness T3 is larger, the thermal conductivity of composite material 10 in the thickness direction is smaller and the linear expansion coefficient of composite material 10 in the in-layer direction is smaller. As the volume ratio of molybdenum in second layer 12 is larger, the thermal conductivity of composite material 10 in the thickness direction is smaller and the linear expansion coefficient of composite material 10 in the in-layer direction is smaller.

Further, copper has a linear expansion coefficient larger than that of molybdenum and has a thermal conductivity larger than that of molybdenum. Therefore, as each of thickness T2 of first layer 11a and thickness T2 of first layer 11b is larger, the linear expansion coefficient of composite material 10 in the in-layer direction is larger and the thermal conductivity of composite material 10 in the thickness direction is larger.

As a result of diligent study by the present inventors, in the case where the volume ratio of molybdenum is more than 13% and less than 43%, where thickness T3 is more than 10% of thickness T1, where the volume ratio of molybdenum in second layer 12 is 55% or more, and where each of thickness T2 of first layer 11a and thickness T2 of first layer 11b is 25% or less of thickness T1, the linear expansion coefficient of composite material 10 in the in-layer direction can be reduced while maintaining the thermal conductivity of composite material 10 in the thickness direction, even after brazing the case member.

Examples

Samples 1 to 37 were prepared as samples of the composite material. Each of samples 1 to 37 is a composite material having the structure shown in FIG. 2. In each of samples 1 to 30, first layer 11 and second layer 12 are bonded together using the hot roll bonding method. In each of samples 31 to 37, first layer 11 and second layer 12 are bonded together using an SPS (Spark Plasma Sintering) method. The SPS method is a method of binding an interface between molded materials such as metals at an atomic level by simultaneously performing Joule heating with supply of current and pressing with a pressing mechanism, and allows for sintering and densification of a powder material as well as metal bonding (diffusion bonding) of different types of materials. In the present example, the latter effect is utilized. It should be noted that when the SPS method is used, layered structure 20 is placed in a graphite mold having a tubular shape, and layered structure 20 is heated to a predetermined temperature and fed with a pressure under supply of pulsed current. This predetermined temperature is a temperature of less than the melting point of copper. The predetermined temperature is, for example, 900° C. For the applied pressure force, a condition is employed such that the relative density of the composite material becomes 99 volume % or more within such an extent that durability of the graphite mold is maintained, and the applied pressure force can be adjusted by appropriately increasing the temperature when it cannot be achieved at the predetermined temperature.

Table 1 shows each of thicknesses T2 of first layer 11a and first layer 11b, the volume ratio of the copper in each of first layer 11a and first layer 11b, thickness T3 of second layer 12, the volume ratio of molybdenum in second layer 12, the number of layers, and the compressive residual stress acting on each of first layer 11a and first layer 11b in each of samples 1 to 37.

Although not shown in Table 1, in each of samples 1 to 37, thickness T1 is 1 mm. Further, in each of samples 1 to 37, the volume ratio of copper in a first layer 11 other than first layer 11a and first layer 11b is 100%. Further, thickness T2 of first layer 11 other than first layer 11a and first layer 11b is not shown in Table 1 because thickness T2 of first layer 11 other than first layer 11a and first layer 11b is normally determined by each of thicknesses T2 of first layer 11a and first layer 11b, thickness T3 of second layer 12, the number of layers, and thickness T1.

TABLE 1

| | First Layer 11a and First Layer 11b | | | Second Layer 12 | | Entire Composite Material | |
|---|---|---|---|---|---|---|---|
| | Thickness T2 (mm) | Volume Ratio of Cu (%) | Compressive Residual Stress (MPa) | Thickness T3 (mm) | Volume Ratio of Mo (%) | Number of Layers | Volume Ratio of Mo (%) |
| Sample 1 | 0.18 | 100 | 32 | 0.65 | 66 | 3 | 43 |
| Sample 2 | 0.30 | 100 | 30 | 0.40 | 66 | 3 | 26 |
| Sample 3 | 0.15 | 100 | 33 | 0.20 | 66 | 5 | 26 |
| Sample 4 | 0.20 | 100 | 32 | 0.20 | 66 | 5 | 26 |
| Sample 5 | 0.20 | 90 | 26 | 0.20 | 66 | 5 | 29 |
| Sample 6 | 0.25 | 100 | 30 | 0.20 | 66 | 5 | 26 |
| Sample 7 | 0.20 | 100 | 31 | 0.25 | 66 | 5 | 33 |
| Sample 8 | 0.20 | 100 | 28 | 0.28 | 66 | 5 | 36 |
| Sample 9 | 0.20 | 100 | 30 | 0.20 | 55 | 5 | 22 |
| Sample 10 | 0.20 | 100 | 25 | 0.20 | 75 | 5 | 30 |
| Sample 11 | 0.20 | 100 | 20 | 0.20 | 85 | 5 | 34 |
| Sample 12 | 0.20 | 100 | 43 | 0.15 | 66 | 5 | 43 |
| Sample 13 | 0.10 | 100 | 34 | 0.20 | 66 | 5 | 26 |
| Sample 14 | 0.20 | 80 | 21 | 0.20 | 66 | 5 | 32 |
| Sample 15 | 0.30 | 100 | 29 | 0.20 | 66 | 5 | 26 |
| Sample 16 | 0.20 | 100 | 47 | 0.10 | 66 | 5 | 13 |
| Sample 17 | 0.20 | 100 | 32 | 0.20 | 50 | 5 | 20 |
| Sample 18 | 0.19 | 100 | 35 | 0.18 | 66 | 7 | 36 |
| Sample 19 | 0.19 | 100 | 32 | 0.20 | 66 | 7 | 40 |
| Sample 20 | 0.15 | 100 | 43 | 0.17 | 66 | 7 | 33 |
| Sample 21 | 0.19 | 100 | 42 | 0.17 | 66 | 7 | 33 |
| Sample 22 | 0.22 | 100 | 41 | 0.17 | 66 | 7 | 33 |
| Sample 23 | 0.19 | 100 | 43 | 0.15 | 66 | 7 | 30 |
| Sample 24 | 0.10 | 100 | 44 | 0.17 | 66 | 7 | 33 |
| Sample 25 | 0.19 | 100 | 44 | 0.10 | 66 | 7 | 20 |
| Sample 26 | 0.15 | 100 | 43 | 0.13 | 66 | 9 | 33 |
| Sample 27 | 0.20 | 100 | 42 | 0.13 | 66 | 9 | 33 |
| Sample 28 | 0.21 | 100 | 41 | 0.13 | 66 | 9 | 33 |
| Sample 29 | 0.10 | 100 | 45 | 0.13 | 66 | 9 | 33 |
| Sample 30 | 0.20 | 100 | 42 | 0.10 | 66 | 9 | 26 |
| Sample 31 | 0.30 | 100 | 103 | 0.40 | 66 | 3 | 26 |
| Sample 32 | 0.20 | 100 | 125 | 0.20 | 66 | 5 | 26 |
| Sample 33 | 0.20 | 100 | 125 | 0.15 | 66 | 5 | 20 |
| Sample 34 | 0.20 | 100 | 125 | 0.20 | 55 | 5 | 20 |
| Sample 35 | 0.19 | 100 | 126 | 0.17 | 66 | 7 | 33 |
| Sample 36 | 0.19 | 100 | 126 | 0.15 | 66 | 7 | 30 |
| Sample 37 | 0.20 | 100 | 125 | 0.13 | 66 | 9 | 33 |

A condition A is defined as a condition that the compressive residual stress acting on each of first layer 11a and first layer 11b is 50 MPa or less. Samples 1 to 30 satisfied condition A, whereas samples 31 to 37 did not satisfy condition A.

A condition B is defined as a condition that each of thicknesses T2 of first layer 11a and first layer 11b is 25% or less of thickness T1. A condition C is defined as a condition that the volume ratio of molybdenum in the composite material is more than 13% and less than 43%.

A condition D is defined as a condition that thickness T3 of second layer 12 is more than 10% of thickness T1. A condition E is defined as a condition that the volume ratio of molybdenum in second layer 12 is 55% or more.

Samples 3 to 14, 18 to 24, and 26 to 29 further satisfied conditions B, C, D, and E. On the other hand, samples 1, 2, 15 to 17, 25 and 30 did not satisfy at least one of conditions B, C, D and E.

A condition F is defined as a condition that the volume ratio of the copper in each of first layer 11a and first layer 11b is 90% or more. A condition G is defined as a condition that each of thicknesses T2 of first layer 11a and first layer 11b is 15% or more of thickness T1.

Samples 3 to 12, 18 to 23, and 26 to 28 further satisfied conditions F and G. On the other hand, samples 13, 14, 24 and 29 did not satisfy at least one of conditions F and G.

A condition H is defined as a condition that the total number of first layers 11 and the number of second layer(s) 12 are 5 or more and thickness T3 is 18% or more of thickness T1. Samples 3 to 11, 18 and 19 further satisfied condition H. On the other hand, samples 12, 20 to 23 and 26 to 28 did not satisfy condition H.

Table 2 shows measurement results of a linear expansion coefficient in the in-layer direction, a thermal conductivity in the thickness direction, and an end-portion temperature difference in each of samples 1 to 37. For the linear expansion coefficient, the following linear expansion coefficients were measured: a linear expansion coefficient ("first linear expansion coefficient" in Table 2) in the in-layer direction when the temperature was changed from the room temperature to 200° C. after holding at 800° C. for 15 minutes; a linear expansion coefficient ("second linear expansion coefficient" in Table 2) in the in-layer direction when the temperature was changed from the room temperature to 200° C. before holding at 800° C. for 15 minutes; and a linear expansion coefficient ("third linear expansion coefficient" in Table 2) in the in-layer direction when the temperature was changed from the room temperature to 800° C. before holding at 800° C. for 15 minutes were measured. The thermal conductivity was measured after holding at 800° C. for 15 minutes.

TABLE 2

|  | First Linear Expansion Coefficient (ppm/K) | Second Linear Expansion Coefficient (ppm/K) | Third Linear Expansion Coefficient (ppm/K) | Thermal Conductivity (W/m·K) | End-Portion Temperature Difference (° C.) |
| --- | --- | --- | --- | --- | --- |
| Sample 1 | 8.2 | 8.1 | 7.6 | 233 | 48.2 |
| Sample 2 | 9.6 | 9.4 | 8.3 | 258 | 39.4 |
| Sample 3 | 9.0 | 8.8 | 7.7 | 313 | 49.9 |
| Sample 4 | 9.2 | 9.0 | 7.9 | 316 | 46.4 |
| Sample 5 | 8.7 | 8.6 | 7.7 | 304 | 48.2 |
| Sample 6 | 9.3 | 9.2 | 8.0 | 320 | 42.9 |
| Sample 7 | 8.9 | 8.7 | 7.8 | 306 | 46.4 |
| Sample 8 | 8.3 | 8.2 | 7.5 | 261 | 46.4 |
| Sample 9 | 9.5 | 9.3 | 8.0 | 328 | 46.4 |
| Sample 10 | 8.9 | 8.7 | 7.7 | 308 | 46.4 |
| Sample 11 | 8.5 | 8.3 | 7.6 | 304 | 46.4 |
| Sample 12 | 9.9 | 9.4 | 8.4 | 332 | 46.4 |
| Sample 13 | 8.7 | 8.5 | 7.6 | 309 | 53.4 |
| Sample 14 | 8.6 | 8.5 | 7.7 | 301 | 50.6 |
| Sample 15 | 11.1 | 10.5 | 8.9 | 323 | 39.4 |
| Sample 16 | 10.9 | 10.4 | 8.6 | 340 | 46.4 |
| Sample 17 | 10.4 | 10.3 | 8.6 | 332 | 46.4 |
| Sample 18 | 9.0 | 8.8 | 7.9 | 300 | 47.1 |
| Sample 19 | 8.8 | 8.6 | 7.9 | 295 | 47.1 |
| Sample 20 | 9.4 | 8.7 | 7.9 | 302 | 49.9 |
| Sample 21 | 9.7 | 8.9 | 8.0 | 304 | 47.1 |
| Sample 22 | 9.8 | 9.0 | 8.0 | 306 | 45.0 |
| Sample 23 | 9.9 | 9.0 | 8.0 | 309 | 47.1 |
| Sample 24 | 9.2 | 8.7 | 7.7 | 299 | 53.4 |
| Sample 25 | 10.7 | 9.8 | 8.6 | 328 | 47.1 |
| Sample 26 | 9.3 | 8.5 | 7.7 | 301 | 49.9 |
| Sample 27 | 9.5 | 8.7 | 7.8 | 303 | 46.4 |
| Sample 28 | 9.6 | 8.7 | 7.9 | 304 | 45.7 |
| Sample 29 | 9.1 | 8.7 | 7.5 | 299 | 53.4 |
| Sample 30 | 10.8 | 9.8 | 8.6 | 316 | 46.4 |
| Sample 31 | 12.9 | 9.5 | 8.3 | 225 | 37.3 |
| Sample 32 | 12.4 | 8.9 | 7.8 | 282 | 46.3 |
| Sample 33 | 13.0 | 9.4 | 7.9 | 291 | 46.1 |
| Sample 34 | 12.8 | 9.2 | 7.8 | 294 | 46.2 |
| Sample 35 | 12.3 | 8.8 | 7.9 | 276 | 46.8 |
| Sample 36 | 12.1 | 8.7 | 7.7 | 278 | 46.9 |
| Sample 37 | 12.4 | 8.5 | 7.6 | 283 | 46.1 |

The first linear expansion coefficients of samples 31 to 37 were larger than the first linear expansion coefficients of samples 1 to 30. As described above, samples 1 to 30 satisfied condition A, whereas samples 31 to 37 did not satisfy condition A.

From this comparison, it was revealed that when the compressive residual stress acting on each of first layer 11a and first layer 11b is 50 MPa or less, a crack can be suppressed from being generated at a bonding interface between first layer 11 and second layer 12 when heat for brazing was applied (low linear expansion coefficient is maintained even after heat for brazing is applied).

Each of samples 3 to 14, 18 to 24, and 26 to 29 further satisfied a condition that the first linear expansion coefficient is 6 ppm/K or more and 10 ppm/K or less and that the thermal conductivity in the thickness in direction is 261 W/m K or more. As described above, samples 3 to 14, 18 to 24, and 26 to 29 further satisfied conditions B, C, D, and E.

From this comparison, it was revealed that when the volume ratio of molybdenum is more than 13% and less than 43%, thickness T3 is more than 10% of thickness T1, each of thicknesses T2 of first layer 11a and first layer 11b is 25% or less of thickness T1, and the volume ratio of molybdenum in second layer 12 is 55% or more, the linear expansion coefficient of composite material 10 in the in-layer direction can be reduced while maintaining the thermal conductivity of composite material 10 in the thickness direction, even after the heat for brazing is applied.

Each of the third linear expansion coefficients of samples 3 to 14, 18 to 24, and 26 to 29 was 7.5 ppm/K or more and 8.5 ppm/K or less. As described above, samples 3 to 14, 18 to 23, and 26 to 28 further satisfied conditions B, C, D, and E.

From this comparison, it was revealed that when the volume ratio of molybdenum is more than 13% and less than 43%, thickness T3 is more than 10% of thickness T1, each of thicknesses T2 of first layer 11a and first layer 11b is 25% or less of thickness T1, and the volume ratio of molybdenum in second layer 12 is 55% or more, a crack can be suppressed from being generated in the brazing material due to a difference between the linear expansion coefficient of composite material 10 and the linear expansion coefficient of the case member.

The end-portion temperature difference in each of samples 3 to 12, 18 to 23 and 26 to 28 was less than 50° C. As described above, samples 3 to 12, 18 to 23, and 26 to 28 further satisfied conditions F and G.

From this comparison, it was revealed that when each of thicknesses T2 of first layer 11a and first layer 11b is 15% or more of thickness T1 and the volume ratio of copper in each of first layer 11a and first layer 11b is 90% or more, the end-portion temperature difference can be reduced.

A difference between the first linear expansion coefficient and the second linear expansion coefficient in each of samples 3 to 11, 18 and 19 was 0.3 ppm/K or less. Further, in each of samples 3 to 11, 18 and 19, the compressive residual stress acting on each of first layer 11a and first layer 11b was 40 MPa or less. From this comparison, it was revealed that when the total number of first layers 11 and second layer(s) 12 was or more and thickness T3 was 18% or more of thickness T1, the compressive residual stress acting on each of first layer 11a and first layer 11b becomes further smaller to suppress the linear expansion coefficient in the in-layer direction from being increased due to application of heat for brazing.

Second Embodiment

A semiconductor package (hereinafter referred to as "semiconductor package 100") according to a second embodiment will be described.

Figure 7:
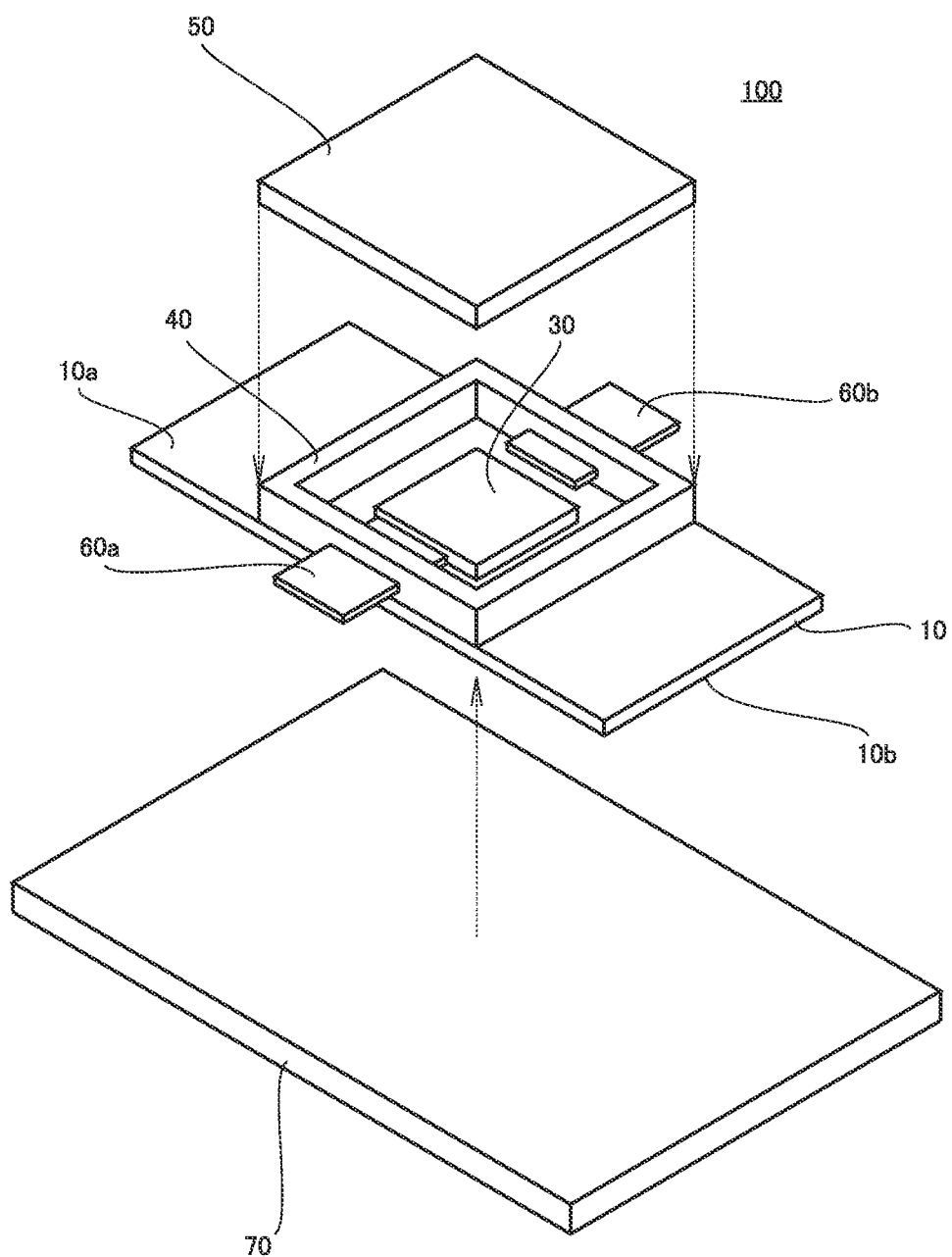
FIG. 7 is an exploded perspective view of a semiconductor package 100.

FIG. 7 is an exploded perspective view of semiconductor package 100. As shown in FIG. 7, semiconductor package 100 has composite material 10, a semiconductor element 30, a case member 40, a cover 50, a terminal 60a, and a terminal 60b.

Composite material 10 functions as a heat spreader in semiconductor package 100. Semiconductor element 30 is disposed on first surface 10a. A heat transfer member may be interposed between semiconductor element 30 and first surface 10a. Semiconductor element 30 is a source of heat generated during an operation.

Case member 40 is composed of, for example, a ceramic material. The ceramic material is, for example, alumina. Case member 40 is disposed on first surface 10a so as to surround semiconductor element 30. The lower end (end on the first surface 10a side) of case member 40 and first surface 10a are bonded together by brazing, for example. Cover 50 is composed of, for example, a ceramic material or a metal material. Cover 50 closes the upper end side of case member 40.

Terminal 60a and terminal 60b are inserted in case member 40. As a result, one end of each of terminal 60a and terminal 60b is located in a space defined by first surface 10a, case member 40, and cover 50, and the other end of each of terminal 60a and terminal 60b is located outside the space. Each of terminal 60a and terminal 60b is composed of, for example, a metal material. The metal material is, for example, Kovar.

Although not shown, the one end side of each of terminal 60a and terminal 60b is electrically connected to semiconductor element 30. Semiconductor package 100 is electrically connected to a device or circuit different from semiconductor package 100 on the other end side of each of terminal 60a and terminal 60b.

A heat radiation member 70 is attached to second surface 10b. Heat radiation member 70 is, for example, a metal plate in which a flow path through which a coolant flows is formed. However, heat radiation member 70 is not limited thereto. Heat radiation member 70 may be, for example, a cooling fin. A heat transfer member may be interposed between heat radiation member 70 and second surface 10b.

The embodiments disclosed herein are illustrative and non-restrictive in any respect. The scope of the present invention is defined by the terms of the claims, rather than the embodiments described above, and is intended to include any modifications within the scope and meaning equivalent to the terms of the claims.

REFERENCE SIGNS LIST

10: composite material; 10a: first surface; 10b: second surface; 11, 11a, 11b: first layer; 12: second layer; 15: thin piece; 16: block; 20: layered structure; 21: first plate member, 22: second plate member; 30: semiconductor element; 40: case member; 50: cover; 60a: terminal; 60b: terminal; 70: heat radiation member; 80: aluminum fin; 90: heating element, 100: semiconductor package; P: load; S1: preparation step, S2: heating step: S3: rolling step; T1, T2, T3: thickness.

The invention claimed is:

1. A composite material having a plate shape, the composite material having a first surface and a second surface opposite to the first surface, the composite material comprising:
   a plurality of first layers; and
   at least one second layer, wherein the first layers and the second layer are alternately layered along a thickness direction of the composite material such that the first layers are located at the first surface and the second surface, each of the first layers is a layer including copper, the second layer is a layer of a molybdenum powder compact impregnated with copper, and wherein the plurality of first layers are bonded to opposite surfaces of the at least one second layer such that a compressive residual stress of 50 MPa or less acts on each of the first layer located at the first surface and the first layer located at the second surface.

2. The composite material according to claim 1, wherein a linear expansion coefficient of the composite material in a direction parallel to the first surface and the second surface when a temperature of the composite material is changed from a room temperature to 200° C. after holding at 800° C. for 15 minutes is 6 ppm/K or more and 10 ppm/K or less, and a thermal conductivity of the composite material in the thickness direction after holding at 800° C. for 15 minutes is 230 W/m·K or more.

3. The composite material according to claim 1, wherein a total number of the first layers and the second layer is 5 or more, and a thermal conductivity of the composite material in the thickness direction after holding at 800° C. for 15 minutes is 261 W/m·K or more.

4. The composite material according to claim 1, wherein a linear expansion coefficient of the composite material in a direction parallel to the first surface and the second surface when a temperature of the composite material is changed from a room temperature to 800° C. before holding at 800° C. for 15 minutes is 7.5 ppm/K or more and 8.5 ppm/K or less.

5. The composite material according to claim 1, wherein each of thicknesses of the first layer located at the first surface and the first layer located at the second surface is 25% or less of a thickness of the composite material, a thickness of the second layer is more than 10% of the thickness of the composite material, a volume ratio of molybdenum in the second layer is 55% or more, and a volume ratio of molybdenum in the composite material is more than 13% and less than 43%.

6. The composite material according to claim 1, wherein a volume ratio of the copper in each of the first layer located at the first surface and the first layer located at the second surface is 90% or more, and each of thicknesses of the first layer located at the first surface and the first layer located at the second surface is 15% or more of a thickness of the composite material.

7. The composite material according to claim 1, wherein a thickness of the second layer is 18% or more of a thickness of the composite material, and a change in a linear expansion coefficient of the composite material in a direction parallel to the first surface and the second surface when a temperature of the composite material is changed from a room temperature to 200° C. before and after holding at 800° C. for 15 minutes is 0.3 ppm/K or less.

8. A composite material having a plate shape, the composite material having a first surface and a second surface opposite to the first surface, the composite material comprising:

a plurality of first layers; and at least one second layer, wherein the first layers and the second layer are alternately layered along a thickness direction of the composite material such that the first layers are located at the first surface and the second surface, each of the first layers is a layer including copper, the second layer is a layer of a molybdenum powder compact impregnated with copper, wherein the plurality of first layers are bonded to opposite surfaces of the at least one second layer such that i) a linear expansion coefficient of the composite material in a direction parallel to the first surface and the second surface when a temperature of the composite material is changed from a room temperature to 200° C. after holding at 800° C. for 15 minutes is 6 ppm/K or more and 10 ppm/K or less, and ii) a thermal conductivity of the composite material in the thickness direction after holding at 800° C. for 15 minutes is 230 W/m·K or more.

9. The composite material according to claim 8, wherein the linear expansion coefficient of the composite material in the direction parallel to the first surface and the second surface when the temperature of the composite material is changed from the room temperature to 800° C. before holding at 800° C. for 15 minutes is 7.5 ppm/K or more and 8.5 ppm/K or less.

10. The composite material according to claim 8, wherein a total number of the first layers and the second layer is 5 or more, and the thermal conductivity of the composite material in the thickness direction after holding at 800° C. for 15 minutes is 261 W/m·K or more.

11. The composite material according to claim 8, wherein each of thicknesses of the first layer located at the first surface and the first layer located at the second surface is 25% or less of a thickness of the composite material, a thickness of the second layer is more than 10% of the thickness of the composite material, a volume ratio of molybdenum in the second layer is 55% or more, and a volume ratio of molybdenum in the composite material is more than 13% and less than 43%.

12. The composite material according to claim 8, wherein a volume ratio of the copper in each of the first layer located at the first surface and the first layer located at the second surface is 90% or more, and each of thicknesses of the first layer located at the first surface and the first layer located at the second surface is 15% or more of a thickness of the composite material.

13. The composite material according to claim 8, wherein a thickness of the second layer is 18% or more of a thickness of the composite material, a change in the linear expansion coefficient of the composite material in the direction parallel to the first surface and the second surface when the temperature of the composite material is changed from the room temperature to 200° C. before and after holding at 800° C. for 15 minutes is 0.3 ppm/K or less.

14. A semiconductor package comprising:

a composite material having a plate shape, the composite material having a first surface and a second surface opposite to the first surface; and a case member brazed to one of the first surface and the second surface, wherein the composite material has a plurality of first layers and at least one second layer, the first layers and the second layer are alternately layered along a thickness direction of the composite material such that the first layers are located at the first surface and the second surface, each of the first layers is a layer including copper, the second layer is a layer of a molybdenum powder compact impregnated with copper, wherein the plurality of first layers are bonded to opposite surfaces of the at least one second layer such that i) a linear expansion coefficient of the composite material in a direction parallel to the first surface and the second surface when a temperature of the composite material is changed from a room temperature to 200° C. is 6 ppm/K or more and 10 ppm/K or less, and ii) a thermal conductivity of the composite material in the thickness direction is 230 W/m·K or more.

15. The semiconductor package according to claim 14, wherein a total number of the first layers and the second layer is 5 or more, and the thermal conductivity of the composite material in the thickness direction after holding at 800° C. for 15 minutes is 261 W/m·K or more.

16. The semiconductor package according to claim 14, wherein each of thicknesses of the first layer located at the first surface and the first layer located at the second surface is 25% or less of a thickness of the composite material, a thickness of the second layer is more than 10% of the thickness of the composite material, a volume ratio of molybdenum in the second layer is 55% or more, and a volume ratio of molybdenum in the composite material is more than 13% and less than 43%.

17. The semiconductor package according to claim 14, wherein a volume ratio of the copper in each of the first layer located at the first surface and the first layer located at the second surface is 90% or more, and each of thicknesses of the first layer located at the first surface and the first layer located at the second surface is 15% or more of a thickness of the composite material.

18. The semiconductor package according to claim 14, wherein a thickness of the second layer is 18% or more of a thickness of the composite material, and a change in the linear expansion coefficient of the composite material in the direction parallel to the first surface and the second surface when the temperature of the composite material is changed from the room temperature to 200° C. before and after holding at 800° C. for 15 minutes is 0.3 ppm/K or less.

* * * * *